(12) United States Patent
Huang et al.

(10) Patent No.: US 8,391,094 B2
(45) Date of Patent: Mar. 5, 2013

(54) MEMORY CIRCUITS, SYSTEMS, AND OPERATING METHODS THEREOF

(75) Inventors: Ming-Chieh Huang, San Jose, CA (US); Kuoyuan Peter Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 345 days.

(21) Appl. No.: 12/692,534

(22) Filed: Jan. 22, 2010

(65) Prior Publication Data
US 2010/0220539 A1 Sep. 2, 2010

Related U.S. Application Data

(60) Provisional application No. 61/151,364, filed on Feb. 10, 2009.

(51) Int. Cl.
*G11C 5/04* (2006.01)
(52) U.S. Cl. .............. 365/226; 365/149; 365/189.09
(58) Field of Classification Search .............. None
See application file for complete search history.

(56) References Cited

U.S. PATENT DOCUMENTS

| | | | |
|---|---|---|---|
| 4,907,199 A | 3/1990 | Dosaka et al. | |
| 4,943,952 A | 7/1990 | Terayama | |
| 4,951,256 A | 8/1990 | Tobita | |
| 5,499,211 A | 3/1996 | Kirihata et al. | |
| 5,544,105 A | 8/1996 | Hirose | |
| 5,561,630 A | 10/1996 | Katoh et al. | |
| 5,926,423 A | 7/1999 | Jeong | |
| 5,973,983 A | 10/1999 | Hidaka | |
| 6,205,067 B1 | 3/2001 | Tsukude | |
| 6,272,037 B1 * | 8/2001 | Miyamoto | 365/145 |
| 6,795,350 B2 * | 9/2004 | Chen et al. | 365/189.07 |
| 7,085,187 B2 | 8/2006 | Koshikawa et al. | |
| 7,260,006 B2 | 8/2007 | Lee | |

FOREIGN PATENT DOCUMENTS

| | | |
|---|---|---|
| JP | 6175739 | 6/1994 |
| JP | 07-057466 | 3/1995 |
| JP | 11-039874 | 2/1999 |
| JP | 2002-124085 | 4/2002 |
| KR | 1020090003623 | 1/1999 |
| KR | 10-0843793 | 7/2008 |
| WO | WO 01/93271 | 12/2001 |

OTHER PUBLICATIONS

OA dated Feb. 21, 2012 from corresponding application No. 026699/2010.
OA dated Apr. 17, 2012 from corresponding application No. CN 201010116642.X.
OA dated Mar. 19, 2012 from corresponding application No. KR 10-2010-0012149.
OA dated Jan. 24, 2012 from corresponding application No. JP2010-026486.
OA dated Jul. 22, 2011 for corresponding application No. KR 10-2010-0012149.

* cited by examiner

*Primary Examiner* — Tan T. Nguyen
(74) *Attorney, Agent, or Firm* — Lowe Hauptman Ham & Berner, LLP

(57) ABSTRACT

A memory circuit includes at least one memory cell for storing a charge representative of a datum. The memory cell is coupled with a word line and a bit line. The memory circuit includes a means for providing a bit line reference voltage $VBL_{ref}$ to the bit line, wherein a $VBL_{ref}/VDD$ ratio of the bit line reference voltage $VBL_{ref}$ to a power voltage VDD is adjustable corresponding to a change of the power voltage VDD.

22 Claims, 5 Drawing Sheets

MEMORY CIRCUITS, SYSTEMS, AND OPERATING METHODS THEREOF

CROSS-REFERENCES TO RELATED APPLICATIONS

The present application is related to U.S. Application Ser. No. 61/151,230, entitled "MEMORY CIRCUITS, SYSTEMS, AND METHODS FOR PROVIDING BIT LINE EQUALIZATION VOLTAGES" filed on Feb. 10, 2009, which is incorporated herein by reference. This present application also is based on, and claims priority from, U.S. Provisional No. 61/151,364 filed Feb. 10, 2009, the disclosure of which is hereby incorporated by reference herein in its entirety.

FIELD OF THE DISCLOSURE

The present disclosure relates generally to the field of semiconductor circuits, and more particularly, to memory circuits, systems, and operating methods thereof.

BACKGROUND

Memory circuits have been used in various applications. Conventionally, memory circuits can include DRAM and SRAM circuits. A DRAM circuit includes a plurality of memory cells. For conventional dynamic memory cells in which arrays of capacitive storage memory cells are provided, each memory cell has an access transistor. Data stored in such memory cells is actually a charge stored on a small capacitor. When the data is to be output, the access transistor is activated by a word line (WL) coupled to the gate or control terminal of the transistor. The access transistor can couple the capacitor to a bit line (BL) coupled to a sense amplifier for sensing the voltage of the capacitor.

SUMMARY

In one embodiment, a memory circuit includes at least one memory cell for storing a charge representative of a datum. The memory cell is coupled with a word line and a bit line. The memory circuit includes a means for providing a bit line reference voltage $VBL_{ref}$ to the bit line, wherein a $VBL_{ref}/VDD$ ratio of the bit line reference voltage $VBL_{ref}$ to a power voltage VDD is adjustable corresponding to a change of the power voltage VDD.

In another embodiment, a system includes a memory circuit and a processor coupled with the memory circuit. The memory circuit includes at least one memory cell for storing a charge representative of a datum. The memory cell is coupled with a word line and a bit line. The memory circuit includes a means for providing a bit line reference voltage $VBL_{ref}$ to the bit line, wherein a $VBL_{ref}/VDD$ ratio of the bit line reference voltage $VBL_{ref}$ to a power voltage VDD is adjustable corresponding to a change of the power voltage VDD. The processor is capable of accessing the datum stored in the at least one memory cell.

In the other embodiment, a method for accessing a memory circuit having at least one memory cell for storing a charge representative of a datum is provided. The memory cell is coupled with a word line and a bit line. The method includes providing a bit line reference voltage $VBL_{ref}$ to the bit line, wherein a $VBL_{ref}/VDD$ ratio of the bit line reference voltage $VBL_{ref}$ to a power voltage VDD is adjustable.

These and other embodiments of the present disclosure, as well as its features are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
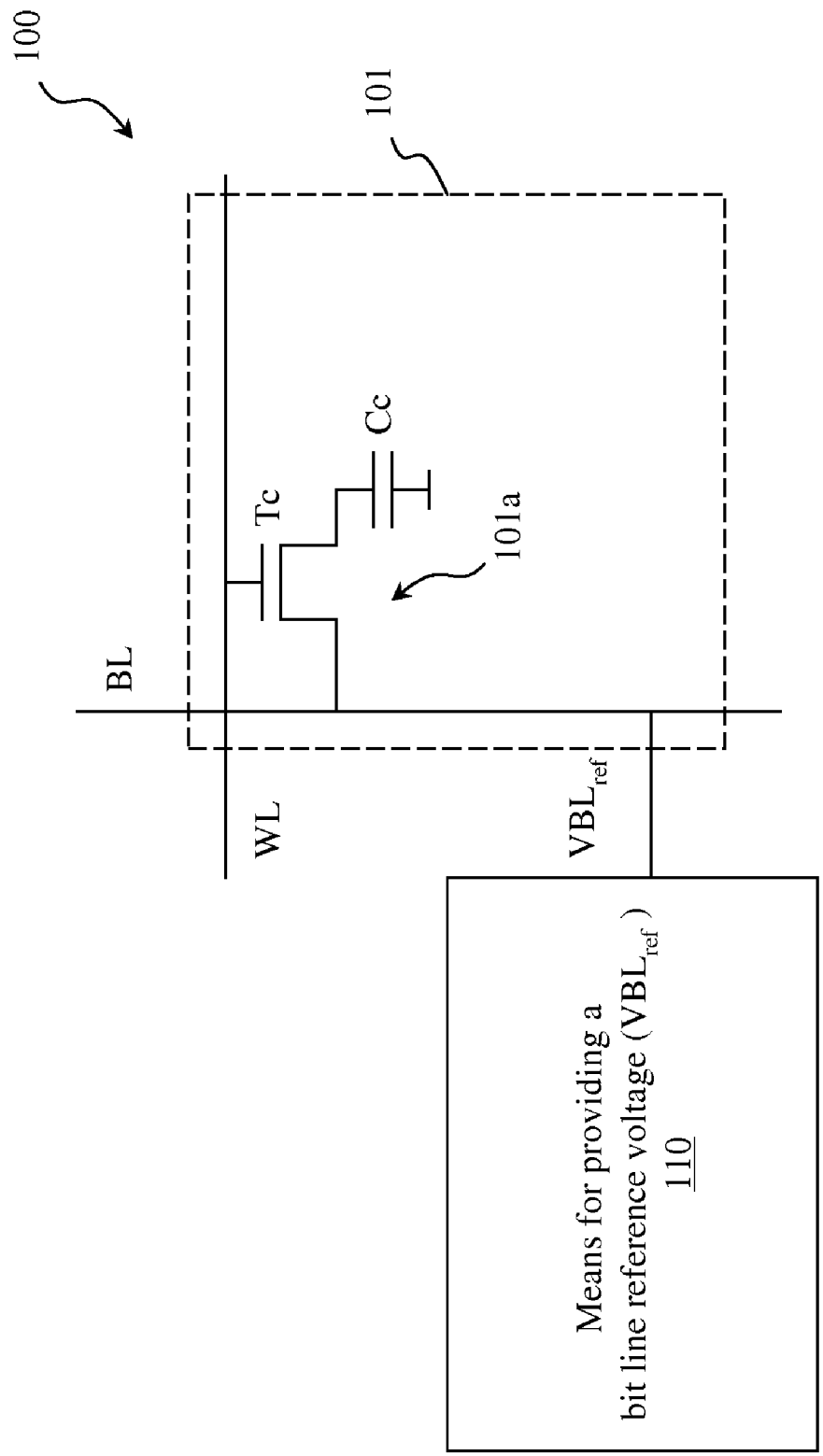
FIG. 1 is a schematic drawing illustrating an exemplary memory circuit.

Conventionally, a bit line reference voltage is applied to the bit line. The bit line reference voltage changes corresponding to the change of the power voltage (VDD) such that the bit line reference voltage is one half of the power voltage (VDD), i.e., the ratio of the bit line reference voltage to the power voltage is 0.5 and fixed. By fixing the ratio, accessing the data stored in the memory capacitor can be substantially free from pulling up or down the bit line voltage VBL. It is found that if the conventional memory circuit operates at the worst corner of Process-Voltage-Temperature (PVT) variations, the margin for reading logical "1" data is smaller than that for reading logical "0". The small margin of the memory cell may result in failing to read logical "1" data.

Based on the foregoing, memory circuits and operating methods thereof are desired.

It is understood that the following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of this disclosure relate to memory circuits, systems, and operating methods thereof. In embodiments, the memory circuit can include a means for providing a bit line reference voltage $VBL_{ref}$ which has an adjustable $VBL_{ref}/VDD$ ratio corresponding to variations of the power voltage VDD. By providing the adjustable $VBL_{ref}/VDD$ ratio, the margin for reading logical "1" as well as logical "0" can be desirably achieved. Following are descriptions of various exemplary embodiments according to the present disclosure. The scope of this disclosure is not limited thereto.

FIG. 1 is a schematic drawing illustrating an exemplary memory circuit. In FIG. 1, a memory circuit 100 can comprise a memory array 101 including a plurality of word lines and a plurality of bit lines. The memory circuit 100 can be a dynamic random access memory (DRAM) circuit, an embedded DRAM circuit, a static random access memory (SRAM) circuit, an embedded SRAM circuit, or other memory circuit. The memory array 101 can include at least one memory cell 101a. The memory cell 101a can be coupled with a bit line (BL) and a word line (WL) of the memory array 101. For embodiments using DRAM cells, the memory cell 101a can include a memory transistor ($T_c$) and a capacitor ($C_c$). The capacitor $C_c$ is capable of storing a charge representative of a datum, e.g., "0" or "1".

It is noted that though only one memory cell 101a is depicted, another cell (not shown) can be placed at the intersection of each of a plurality of word lines (WL) and the bit lines (BL). A portion of a memory circuit 100 may have 8, 16, 32, 64, 128 or more columns that can be arranged in word widths. In embodiments, the word lines can be laid out substantially orthogonally to the bit lines. In other embodiments, other arrangements of the word lines and bit lines can be provided.

Referring to FIG. 1, the memory circuit 100 can include a means 110 for providing a bit line reference voltage $VBL_{ref}$ to the bit line BL, wherein a $VBL_{ref}$/VDD ratio of the bit line reference voltage $VBL_{ref}$ to a power voltage VDD, e.g., an internal power voltage, is adjustable corresponding to a change of the power voltage VDD. The change of the power voltage can correspond to PVT variations. As noted, the $VBL_{ref}$/VDD ratio is adjustable corresponding to the change of the power voltage VDD. For embodiments using a 0.9-V nominal voltage, the power voltage VDD can vary from 0.75 V to 1.05V. The $VBL_{ref}$/VDD ratio can be adjustable between about 0.43 and about 0.53.

Following are descriptions regarding an access cycle of the memory cell 101a. For accessing the datum stored in the memory cell 101a, the word line WL can transition to a row select state to turn on the memory transistor $T_c$. For embodiments using an N-channel MOS transistor, the word line WL can transition to a high positive voltage to cause the memory transistor $T_c$ to couple the capacitor $C_c$ to the bit line BL. The word line WL is supplied by an address decode circuit (not shown) that can determine which row in the memory array 101 is active based on an address previously supplied to the memory array 101. After the word line WL goes active by transitioning to a positive voltage level, the memory transistor $T_c$ couples the capacitor $C_c$ of the memory cell 101a to the bit line BL, and a "charge sharing" portion of the access cycle begins. If the stored data in memory cell 101a is a logical "1" the capacitor $C_c$ will add voltage to the bit line reference voltage $VBL_{ref}$ that can be applied on the bit line BL during the charge sharing operation. In response, a small voltage ΔVBL can be increased on the bit line BL. If the stored data of the memory cell 101a is a logical "0" the capacitor $C_c$ may subtract voltage from the bit line BL, for example, by charging the capacitor $C_c$ in the memory cell 101a from the bit line BL. Due to the charging, a voltage ΔVBL can be decreased from the bit line BL.

Shortly after the "charge sharing" has begun, a sensing portion of the access cycle can start. In this part of the access cycle, a sense amplifier (not shown) coupled with the bit line BL can sense the ΔVBL attributed to the memory cell 101a.

After the sensing portion, a restore portion of the access cycle can start. In embodiments, the restore portion of the access cycle may follow the sensing portion by a time period of one or more logic gate delays. During the restore portion, the bit line BL can be coupled with a high voltage, causing the bit line voltage VBL to increase from the bit line reference voltage $VBL_{ref}$ plus the sensed differential voltage ΔVBL to a logical "1" high voltage or approximately to the power voltage VDD. At this point in the access cycle, the word line WL can be still active so that the high voltage on the bit line BL can be coupled into the memory cell 101a. The memory transistor $T_c$ of memory cell 101a will couple this high voltage to the capacitor $C_c$ and thus restore the stored charge for future accesses to this memory cell 101a.

The access cycle may be completed when local bit lines such as the bit line BL are coupled to global bit lines GBL (not shown) by operations of column select line CSL (not shown). This action can cause the data represented by the voltage potentials on the bit line BL to be coupled to the global bit lines GBL for use by circuits (not shown) external to the memory array 101. It is noted that the access cycle of the memory cell 101 described above is a mere example. One of skilled in the art is able to modify the sequence and/or add additional steps to achieve a desired access cycle.

Following are descriptions regarding simulation results based on the access cycle of the memory cell described above. Table 1 shows simulation results at the worst corner such as the SSS corner of Process-Voltage-Temperature (PVT) variations at a high temperature, wherein the SSS corner represents the worst corner when the speeds of PMOS transistors, NMOS transistors, and the memory cell of the memory circuit are slow.

TABLE 1

| VDD | VPP | VBL | Ratio | Cycle | Temp. | WL Pulse | ΔVBL of logical "0" | ΔVBL of logical "1" |
|---|---|---|---|---|---|---|---|---|
| _1.035 V | 1.480 V | 0.518 V | 0.5 | 2.00 ns | 125° C. | 2.55 ns | 123 mV | 66 mV |
| _1.035 V | 1.480 V | 0.486 V | 0.47 | 2.00 ns | 125° C. | 2.55 ns | 116 mV | 75 mV |
| _1.035 V | 1.480 V | | | | | | | |

In embodiments, the nominal voltage can be about 0.9 V and a theoretical power voltage is equal to the nominal voltage, i.e., 0.9 V. At the SSS corner, the power voltage VDD may shift to around 1.035 V. Voltage VPP represents the voltage applied to the word line WL to turn on the memory transistor $T_c$. The simulation conditions can be set with an access frequency of about 500 MHz and a high temperature of about 125° C.

For a conventional memory circuit, the $VBL_{ref}$/VDD ratio is fixed, i.e., $VBL_{ref}$=½ VDD. At normal operation, the power voltage VDD can be about 0.9 V and the bit line reference voltage $VBL_{ref}$ can be about 0.45 V. The logical "0" and "1" data of the conventional memory circuit can be accessed. As noted if the memory circuit operates at the SSS corner, the power voltage VDD can shift to about 1.035 V. Based on the fixed VBL$_{ref}$/VDD ratio, i.e., 0.5, the bit line voltage VBL$_{ref}$ is about 0.518 V. From the simulation results, the ΔVBL of a logical "0" memory cell is around 123 mV and the ΔVBL of a logical "1" memory cell is around 66 mV as shown in the second row of Table 1. It is found that the ΔVBL of a logical "1" memory cell may be too small to be sensed by the sense amplifier and the logical "1" data stored in the memory cell cannot be accessed. Thus, accessing the logical "1" data of the conventional memory circuit having a fixed VBL$_{ref}$/VDD ratio may fail at the SSS corner of the PVT variations.

In contrary, the memory circuit 100 includes the means 110 for providing the bit line reference voltage VBL$_{ref}$ to the bit line, wherein the VBL$_{ref}$/VDD ratio is adjustable. For example, during normal operation having the power voltage of about 0.9 V the VBL$_{ref}$/VDD ratio can be about 0.5. At the SSS corner the means 110 may provide the bit line reference voltage VBL$_{ref}$ of about 0.414 V to the bit line BL. Since the power voltage VDD is about 1.035V, the VBL$_{ref}$/VDD ratio is about 0.4. From the simulation results, the ΔVBL of a logical "0" memory cell is around 98 mV and the ΔVBL of a logical "1" memory cell is around 97 mV as shown in row 2 of Table 1. Compared with the simulation results corresponding to the VBL$_{ref}$/VDD ratio being about 0.5, the ΔVBL of the logical "0" memory cell declines and the ΔVBL of the logical "1" memory cell increases. The sense amplifier (not shown) coupled with the bit line BL may still sense the ΔVBL of the logical "0" memory cell and the ΔVBL of the logical "1" memory cell. Accordingly, the data of the memory cell, either logical "0" or "1", can be accessed.

Table 2 shows other simulation results at the SSS corner of Process-Voltage-Temperature (PVT) variations at a low temperature. The low temperature is around −40° C.

Figure 2:
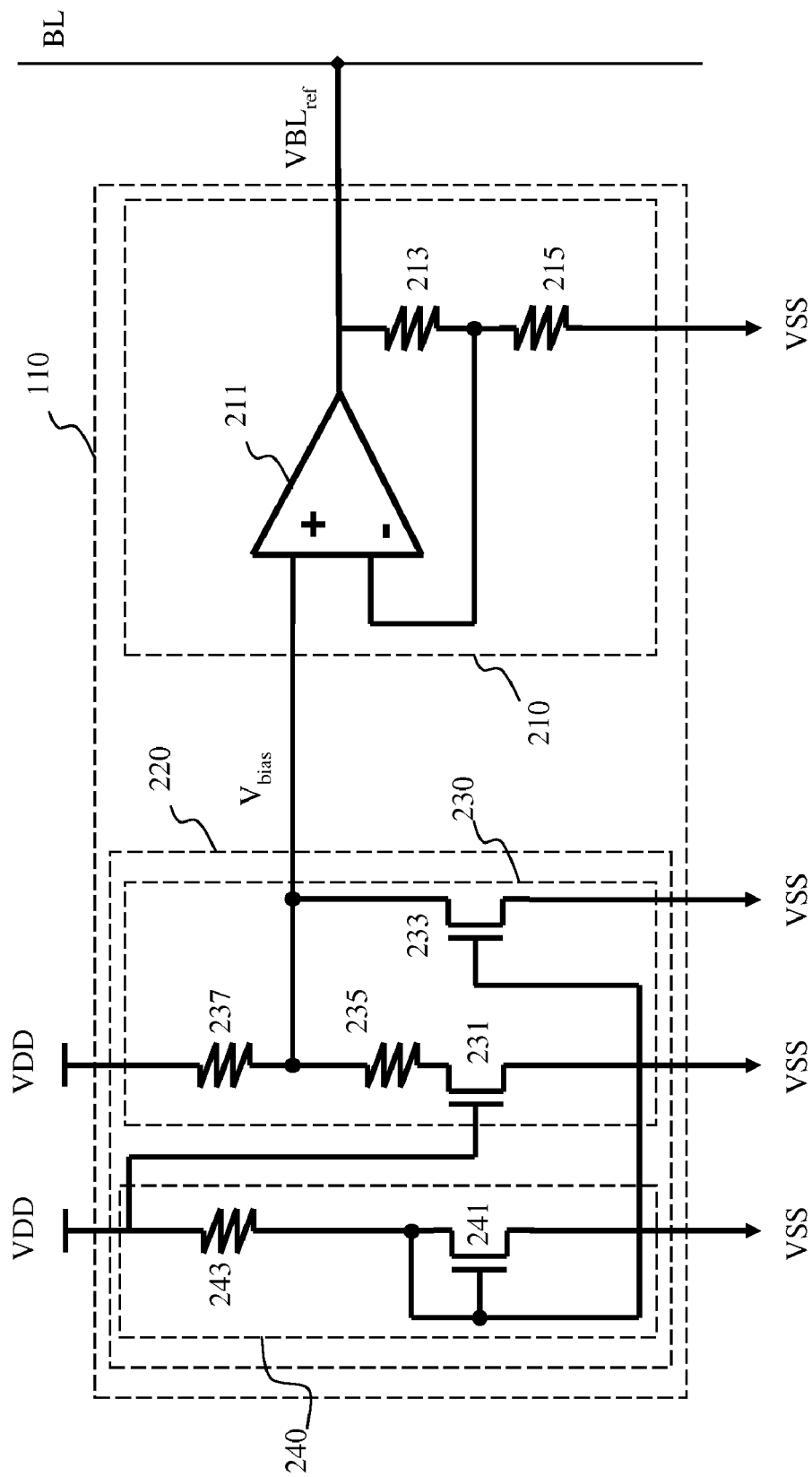
FIG. 2 is a schematic drawing illustrating an exemplary means for providing a bit line reference voltage ($VBL_{ref}$).

FIG. 2, the means 110 for providing the bit line reference voltage VBL$_{ref}$ can include a voltage regulator 210 coupled with the bit line BL and a means 220 for providing a bias voltage V$_{bias}$. A V$_{bias}$/VDD ratio of the bias voltage to the power voltage (VDD) is adjustable. The means 220 can be coupled with the voltage regulator 210.

Referring to FIG. 2, the voltage regulator 210 can be configured to regulate and/or amplify the bias voltage V$_{bias}$ from the means 220. In various embodiments, the voltage regulator 210 can include an amplifier 211. An output end of the amplifier 211 can be coupled with the bit line BL. An input end of the amplifier 211 can be coupled with the means 220. The voltage regulator 210 can include resistors 213 and 215. The resistor 213 can be coupled with the output end of the amplifier 211 and the resistor 215 can be coupled with a low voltage such as a VSS or ground. A voltage at the node between the resistors 213 and 215 can be fed back to another input end of the amplifier 211. It is noted the configuration of the voltage regulator 210 is a mere example. The number and configuration of the resistors 213 and 215 are merely exemplary. The scope of this disclosure is not limited thereto.

Referring to FIG. 2, the means 220 can include a voltage compensation circuit 230 coupled with a self-bias circuit 240. The voltage compensation circuit 230 can be coupled with the voltage regulator 210. The self-bias circuit 230 is capable of controlling the voltage compensation circuit to adjust the bias voltage V$_{bias}$ provided by the means 220.

In various embodiments, the voltage compensation circuit 230 can include switches 231, 233 and resistors 235, 237. The switches 231 and 233 can be NMOS transistors, PMOS transistors, transistors, other switches, and/or combinations thereof. The resistors 235, 237 can have the same or different

TABLE 2

| VDD | VPP | VBL | Ratio | Cycle | Temp. | WL Pulse | ΔVBL of logical "0" | ΔVBL of logical "1" |
|---|---|---|---|---|---|---|---|---|
| 1.035 V | 1.480 V | 0.518 V | 0.5 | 2.00 ns | −40° C. | 2.53 ns | 129 mV | 90 mV |
| 1.035 V | 1.480 V | 0.414 V | 0.4 | 2.00 ns | −40° C. | 2.53 ns | 104 mV | 117 mV |

At the low temperature, the VBL$_{ref}$/VDD ratio can be adjusted to about 0.4 as shown at the second row of Table 2. It is found that the ΔVBL of a logical "0" memory cell is around 104 mV and the ΔVBL of a logical "1" memory cell is around 117 mV. Compared with the simulation results corresponding to the VBL/VDD ratio being about 0.5 (shown at the first row of Table 2), the ΔVBL of the logical "0" memory cell declines and the ΔVBL of the logical "1" memory cell increases. The sense amplifier (not shown) coupled with the bit line BL may still sense the ΔVBL of the logical "0" memory cell and the ΔVBL of the logical "1" memory cell. The data of the memory cell, either logical "0" or "1", can be accessed, even if the VBL$_{ref}$/VDD is adjusted to about 0.4.

Based on the foregoing, the means 110 can provide the bit line reference voltage VBL$_{ref}$ that has the adjustable VBL$_{ref}$/VDD ratio corresponding to the power voltage VDD variations. At normal operation, the VBL$_{ref}$/VDD ratio of the memory circuit 100 may be adjusted to around 0.5. At the SSS corner, the VBL$_{ref}$/VDD ratio of the memory circuit 100 may be adjusted to around 0.4. By using the adjustable VBL$_{ref}$/VDD ratio, the memory circuit 100 can desirably access logical "0" and "1" data at the normal operation and the SSS corner of the PVT variations.

FIG. 2 is a schematic drawing illustrating an exemplary means for providing a bit line reference voltage VBL$_{ref}$. In resistances. The gate of the switch 231 can be coupled with the power voltage VDD and the switch 231 can be coupled between the resistor 235 and a low voltage such as VSS or ground. The resistor 235 can be coupled with the resistor 237. The output end of the voltage compensation circuit 230 between the resistors 235, 237 can be coupled with the voltage regulator 210. The gate of the switch 233 can be coupled with the self-bias circuit 240. The switch 233 can be coupled between the output end of the voltage compensation circuit 230 and a low voltage such as VSS or ground. It is noted that the number and configuration of the switches 231, 233 and resistors 235, 237 are merely examples. The scope of the invention is not limited thereto.

The self-bias circuit 240 can include at least one saturation mode transistor 241 and at least one resistor 243. The output end of the self-bias circuit 240 can be coupled with the voltage compensation circuit 230. The saturation mode transistor 241 can be coupled between the output end of the self-bias circuit 240 and a low voltage such as VSS or ground. The saturation mode transistor 241 is capable of reducing the process-voltage-temperature (PVT) variations of the memory circuit 100 (shown in FIG. 1). The resistor 243 can represent a single resistor or a plurality of series resistors. The resistor 243 can be coupled between the power voltage (VDD) and the output end of the self-bias circuit 240. It is noted that the number and configuration of the saturation mode transistor 241 and resistor 243 are mere examples. The scope of this disclosure is not limited thereto.

Following are descriptions regarding an exemplary operation for providing a bit line reference voltage $VBL_{ref}$ that has an adjustable $VBL_{ref}$/VDD ratio. During an access cycle, the power voltage VDD is applied to the self-bias circuit 240 and the voltage compensation circuit 230. The power voltage VDD can turn on the switch 231, coupling the resistor 235 with the VSS to provide an output voltage, i.e., the bias voltage $V_{bias}$, at the node between the resistors 235 and 237. Due to the power voltage VDD, the self-bias circuit 230 can output a voltage to turn on the switch 233, coupling the node between the resistors 235, 237 with the VSS and further pulling down the bias voltage $V_{bias}$. The pull-down of the bias voltage $V_{bias}$ at the node between the resistors 235 and 237 can be adjusted corresponding to the variation of the power voltage VDD. The bias voltage $V_{bias}$ therefore can have an adjustable $V_{bias}$/VDD ratio corresponding to the variation of the VDD.

In embodiments, the adjustable $V_{bias}$/VDD ratio has a first change rate if the power voltage VDD is equal to or more than about the nominal voltage and a second change rate if the power voltage VDD is less than about the nominal voltage, wherein the first change rate is larger than the second change rate. For example, the nominal voltage is about 0.9 V. If the power voltage VDD is less than about 0.9 V, the self-bias circuit 240 may output a small voltage that may turn on the switch 233 and pull down a small amount of the bias voltage $V_{bias}$. If the power voltage VDD is equal to or more than about 0.9 V, the self-bias circuit 240 may output a large voltage that may turn on the switch 233 and pull down a large amount of the bias voltage $V_{bias}$. Based on the foregoing, the bias voltage $V_{bias}$ may change more corresponding the change of the power voltage VDD if the power voltage VDD is equal to or more than 0.9V than that if the power voltage VDD is less than 0.9 V. In embodiments, the adjustable $V_{bias}$/VDD ratio can continuously change corresponding to the power voltage VDD variations.

Figure 3:
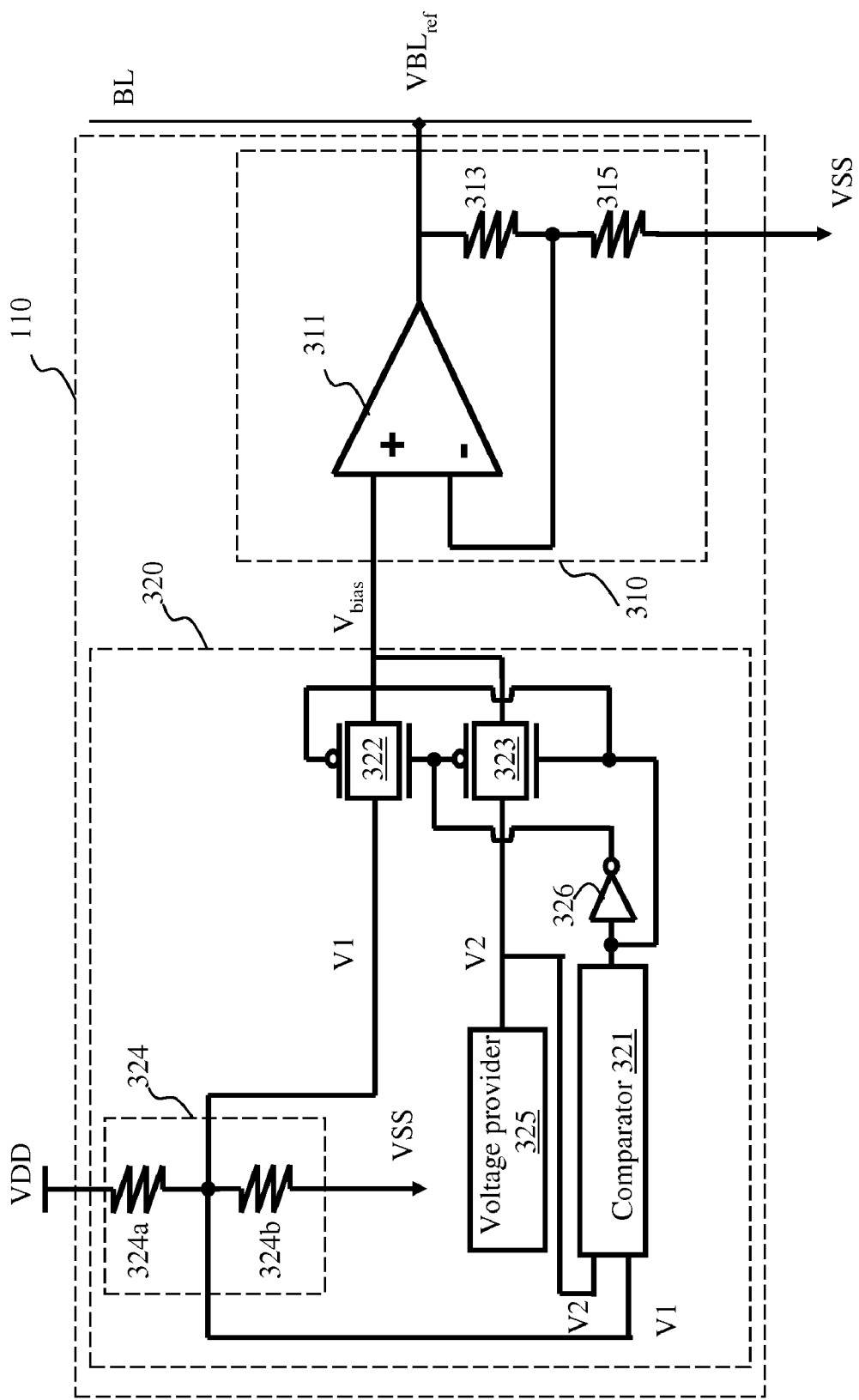
FIG. 3 is a schematic drawing showing another exemplary means for providing a bit line reference voltage ($VBL_{ref}$) to the bit line.

FIG. 3 is a schematic drawing showing another exemplary means for providing a bit line reference voltage $VBL_{ref}$ to the bit line. In FIG. 3, the means 110 for providing the bit line reference voltage $VBL_{ref}$ can include a voltage regulator 310 coupled with the bit line BL and a means 320 for providing a bias voltage $V_{bias}$. A $V_{bias}$/VDD ratio of the bias voltage $V_{bias}$ to the power voltage (VDD) is adjustable. The means 320 can be coupled with the voltage regulator 310. Items of voltage regulator 310 in FIG. 3 that are the same items of the voltage regulator 210 in FIG. 2 are indicated by the same reference numerals, incremented by 100.

Referring to FIG. 3, the means 320 can include a comparator 321 coupled with switches 322, 323 that can be coupled with the voltage regulator 310. In embodiments, each of the switches 322, 323 can include at least one pass gate, transistor, other switching device, and/or combinations thereof. In embodiments, the means 320 can include an inverter 326 coupled between the comparator 321 and the switches 322, 323 for turning on the switch 322 or 323. The means 320 can include voltage providers 324, 325 between the comparator 321 and the switches 322, 323, respectively. In various embodiments, the voltage provider 324 can include resistors 324a, 324b coupled between the power voltage VDD and a low voltage such as VSS or ground. The output end of the voltage provider 324 can be coupled with the switch 322 and the comparator 321. The voltage provider 325 can be a constant voltage provider or a voltage provider that is capable of providing a reference voltage having a change corresponding to the power voltage VDD variation different from the voltage provider 324. It is noted that the voltage providers 324, 325 shown in FIG. 3 are mere examples. The scope of this disclosure is not limited thereto.

Figure 4:
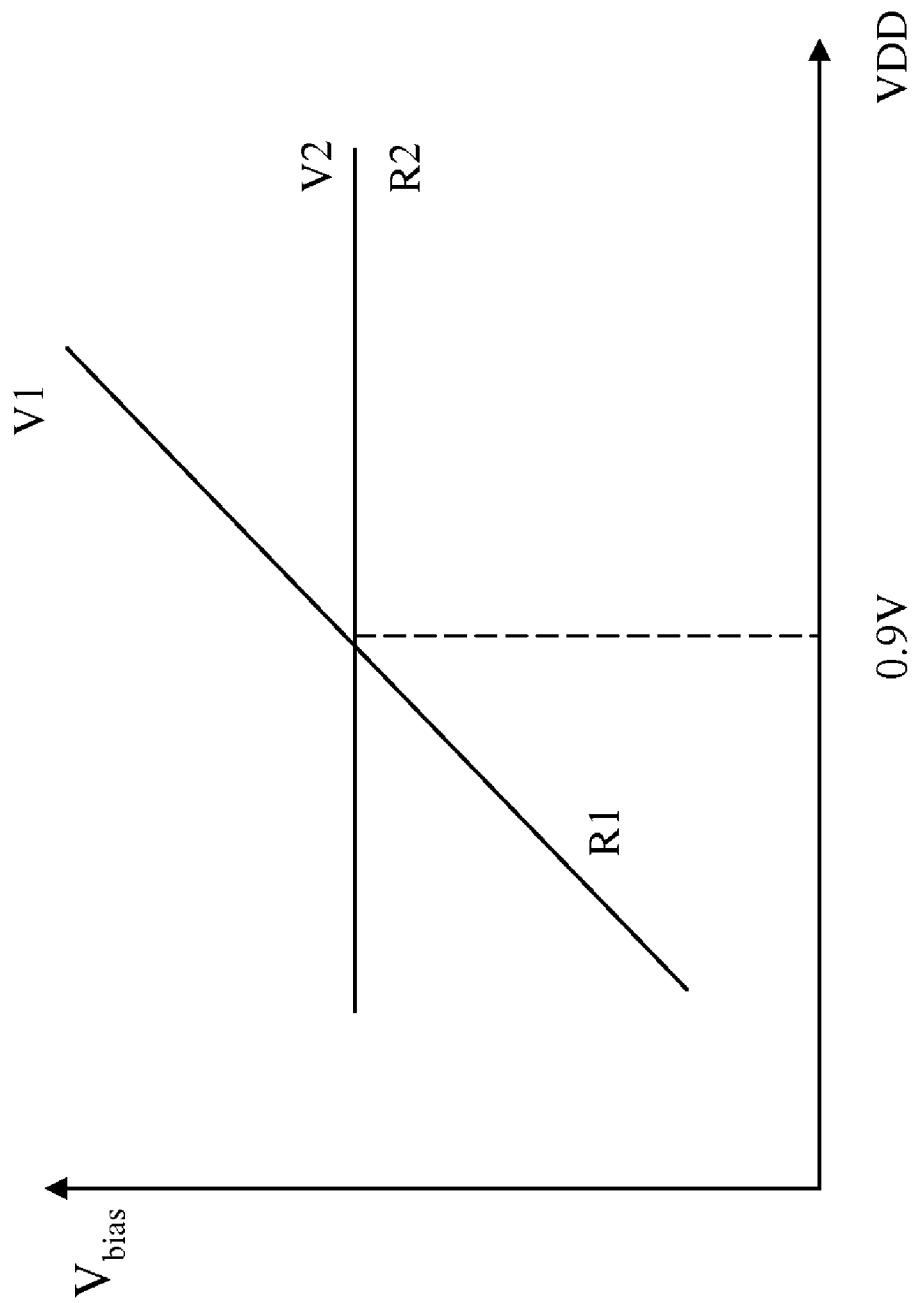
FIG. 4 is a drawing illustrating an output bias voltage $V_{bias}$ of an exemplary means corresponding to the change of a power voltage VDD.

The comparator 321 is capable of selecting one of at least two reference voltages which is lower and turning on the first switch or the second switch corresponding to the selected reference voltage. For example, the comparator 321 can receive two reference voltages V1, V2 from voltage providers 324, 325, respectively. In embodiments, the reference voltage V1 can vary corresponding to the change of the power voltage VDD and reference voltage V2 can be a constant voltage as shown in FIG. 4. In embodiments using 0.9-V nominal voltage, the reference voltage V1 is lower than the reference voltage V2 when the power voltage VDD is lower than 0.9V. The comparator 321 can output a signal to an inverter 326, turning on the switch 322 to output the reference voltage V1 as the bias voltage $V_{bias}$. If the power voltage VDD is equal to or more than about the nominal voltage, e.g., 0.9 V, the reference voltage V2 is lower than the reference voltage V1. The comparator 321 can output a signal to the inverter 326, turning on the switch 323 to output the reference voltage V2 as the bias voltage $V_{bias}$. In some embodiments, the reference voltage V1 is substantially equal to the reference voltage V2. The comparator 321 can select either one of the references voltages V1, V2 as the bias voltage $V_{bias}$.

Referring to FIG. 4, the adjustable $V_{bias}$/VDD ratio can include at least two fixed $V_{bias}$/VDD ratios, R1 and R2. The ratio R1 represents the V1/VDD ratio and the ratio represents the V2/VDD ratio. By comparing the reference voltages V1, V2, the means 220 (shown in FIG. 3) can output the selected reference voltage that is lower as the bias voltage $V_{bias}$. It is noted that the adjustable $V_{bias}$/VDD ratio can include more than two fixed ratios, such as 3, 4, 5, etc. One of skill in the art is able to increase the number of the switches and voltage providers and modify the configuration of the switches and voltage providers to achieve any desired means 220.

Figure 5:
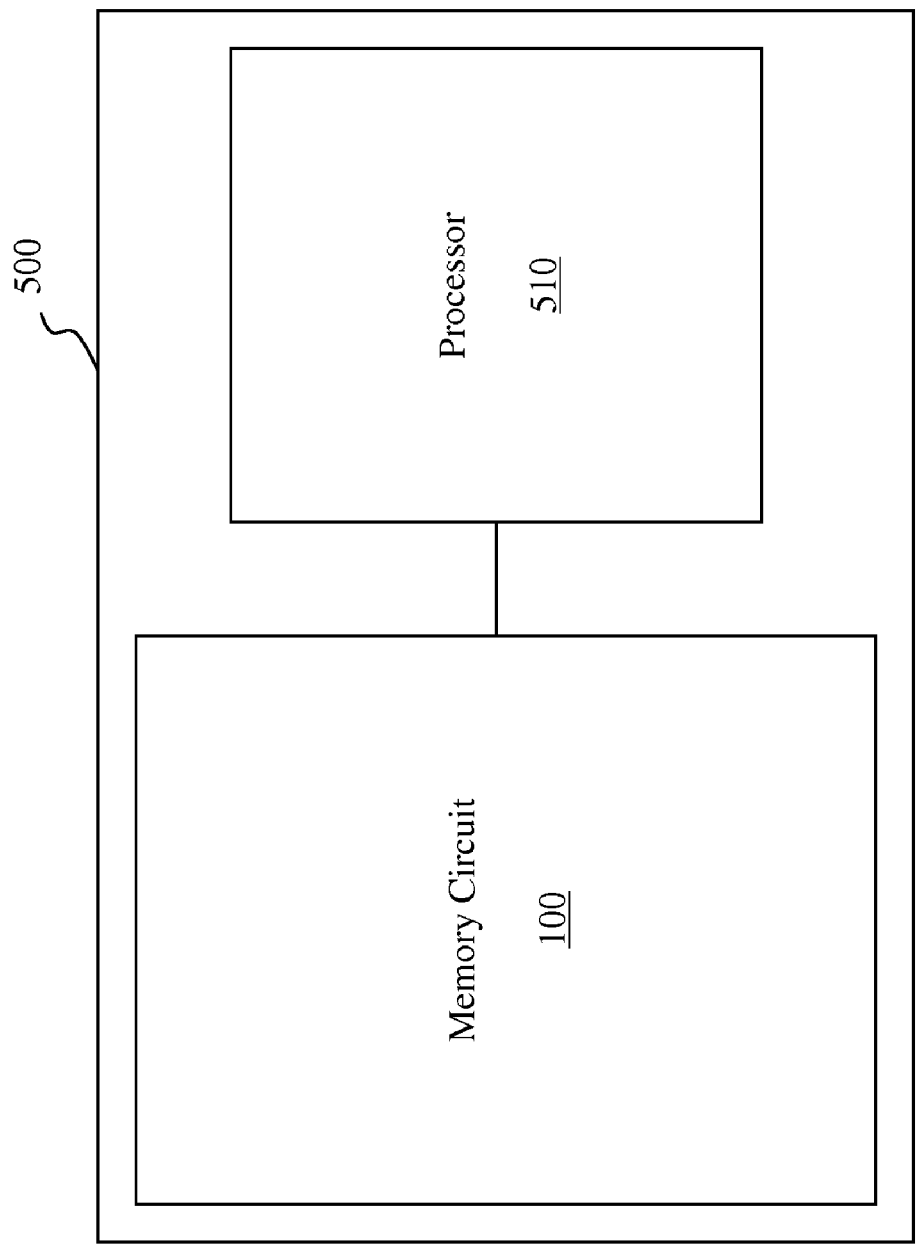
FIG. 5 is a schematic drawing illustrating a system comprising an exemplary memory circuit.

FIG. 5 is a schematic drawing showing a system including an exemplary memory circuit. In FIG. 5, a system 500 can include a processor 510 coupled with the memory circuit 100. The processor 510 is capable of accessing the datum stored in the memory cell 101a (shown in FIG. 1) of the memory circuit 100. In embodiments, the processor 510 can be a processing unit, central processing unit, digital signal processor, or other processor that is suitable for accessing data of memory circuit.

In embodiments, the processor 510 and the memory circuit 100 can be formed within a system that can be physically and electrically coupled with a printed wiring board or printed circuit board (PCB) to form an electronic assembly. The electronic assembly can be part of an electronic system such as a computer, a wireless communication device, a computer-related peripheral, an entertainment device, or the like.

In embodiments, the system 500 including the memory circuit 100 can provides an entire system in one integrated circuit (IC), so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
    at least one memory cell for storing a charge representative of a datum, the memory cell being coupled with a word line and a bit line; and
    a means for providing a bit line reference voltage $VBL_{ref}$ to the bit line, wherein a $VBL_{ref}/VDD$ ratio of the bit line reference voltage $VBL_{ref}$ to a power voltage VDD is adjustable corresponding to a change of the power voltage VDD.

2. The memory circuit of claim 1, wherein the means for providing the bit line reference voltage comprises:
    a voltage regulator coupled with the bit line; and
    a means for providing a bias voltage $V_{bias}$ to an input end of the voltage regulator, wherein a $V_{bias}/VDD$ ratio of the bias voltage $V_{bias}$ to the power voltage VDD is adjustable.

3. The memory circuit of claim 2, wherein the adjustable $V_{bias}/VDD$ ratio has a first change rate if the power voltage VDD is equal to about or more than a nominal voltage, the adjustable $V_{bias}/VDD$ ratio has a second change rate if the power voltage VDD is less than about the nominal voltage, and the first change rate is larger than the second change rate.

4. The memory circuit of claim 3, wherein the means for providing the bias voltage comprises:
    a voltage compensation circuit coupled with the voltage regulator; and
    a self-bias circuit coupled with the voltage compensation circuit, wherein the self-bias circuit is configured to control the voltage compensation circuit to adjust the bias voltage.

5. The memory circuit of claim 4, wherein the self-bias circuit comprises at least one saturation mode transistor coupled with at least one resistor and an output end of the bias circuit is coupled with the voltage compensation circuit.

6. The memory circuit of claim 5, wherein the voltage compensation circuit comprises:
    a switch coupled to the output end of the self-bias circuit, wherein the self-bias circuit is configured to control the switch to adjust the bias voltage.

7. The memory circuit of claim 2, wherein the adjustable $V_{bias}/VDD$ ratio comprises at least two fixed $V_{bias}/VDD$ ratios corresponding to at least two reference voltages.

8. The memory circuit of claim 7, wherein the means for providing the bias voltage comprises:
    a first switch coupled with the voltage regulator;
    a second switch coupled with the voltage regulator; and
    a comparator coupled with the first switch and the second switch, wherein the comparator is capable of selecting one of the at least two reference voltages which is lower and turning on the first switch or the second switch corresponding to the selected reference voltage.

9. The memory circuit of claim 8, wherein the at least two reference voltages comprises a first reference voltage having a constant value and a second reference voltage having a value varying corresponding to the change of the power voltage VDD.

10. A system comprising:
    a memory circuit comprising:
        at least one memory cell for storing a charge representative of a datum, the memory cell being coupled with a word line and a bit line; and
        a means for providing a bit line reference voltage $VBL_{ref}$ to the bit line, wherein a $VBL_{ref}/VDD$ ratio of the bit line reference voltage $VBL_{ref}$ to a power voltage VDD is adjustable corresponding to a change of the power voltage VDD; and
    a processor coupled with the memory circuit for accessing the datum stored in the at least one memory cell.

11. The system of claim 10, wherein the means for providing the bit line voltage comprises:
    a voltage regulator coupled with the bit line; and
    a means for providing a bias voltage to an input end of the voltage regulator, wherein a $V_{bias}/VDD$ ratio of the bias voltage $V_{bias}$ to the power voltage VDD is adjustable.

12. The system of claim 11, wherein the adjustable $V_{bias}/VDD$ ratio has a first change rate if the power voltage VDD is equal to about or more than a nominal voltage, the adjustable $V_{bias}/VDD$ ratio has a second change rate if the power voltage VDD is less than about the nominal voltage, and the first change rate is larger than the second change rate.

13. The system of claim 12, wherein the means for providing the bias voltage comprises:
    a voltage compensation circuit coupled with the voltage regulator; and
    a self-bias circuit coupled with the voltage compensation circuit, wherein the self-bias circuit is configured to control the voltage compensation circuit to adjust the bias voltage.

14. The system of claim 13, wherein the self-bias circuit comprises at least one saturation mode transistor coupled with at least one resistor and an output of the bias circuit is coupled with the voltage compensation circuit.

15. The system of claim 14, wherein the voltage compensation circuit comprises:
    a switch coupled to the output end of the self-bias circuit, wherein the self-bias circuit is configured to control the switch to adjust the bias voltage.

16. The system of claim 11, wherein the adjustable $V_{bias}/VDD$ ratio comprises at least two fixed $V_{bias}/VDD$ ratios corresponding to at least two reference voltages.

17. The system of claim 16, wherein the means for providing the bias voltage comprises:
    a first switch coupled with the voltage regulator;
    a second switch coupled with the voltage regulator; and
    a comparator coupled with the first switch and the second switch, wherein the comparator is capable of selecting one of the at least two reference voltages which is lower and turning on the first switch or the second switch corresponding to the selected reference voltage.

18. The system of claim 17, wherein the at least two reference voltages comprises a first reference voltage having a constant value and a second reference voltage having a value varying corresponding to the change of the power voltage VDD.

19. A method for accessing a memory circuit having at least one memory cell for storing a charge representative of a datum, the memory cell being coupled with a word line and a bit line, the method comprising:
    providing a bit line reference voltage $VBL_{ref}$ to the bit line, wherein a $VBL_{ref}/VDD$ ratio of the bit line reference voltage $VBL_{ref}$ to a power voltage VDD is adjustable.

20. The method of claim 19, wherein providing the bit line reference voltage $VBL_{ref}$ to the bit line comprises:

providing a bias voltage $V_{bias}$, wherein a $V_{bias}$/VDD ratio of the bias voltage $V_{bias}$ to the power voltage VDD is adjustable; and regulating the bias voltage $V_{bias}$ for providing the bit line reference voltage $VBL_{ref}$.

21. The method of claim 20, wherein the adjustable $V_{bias}$/VDD ratio has a first change rate if the power voltage VDD is equal to about or more than a nominal voltage, the adjustable $V_{bias}$/VDD ratio has a second change rate if the power voltage VDD is less than about the nominal voltage, and the first change rate is larger than the second change rate.

22. The method of claim 20, wherein the adjustable $V_{bias}$/VDD ratio comprises at least two fixed $V_{bias}$/VDD ratios corresponding to at least two reference voltages.

* * * * *